(12) United States Patent
Wang et al.

(10) Patent No.: US 12,049,728 B2
(45) Date of Patent: Jul. 30, 2024

(54) ELECTROMAGNETIC SHIELDING PAPER BASED ON MODIFICATION OF CONDUCTIVE MOF MATERIAL AND PREPARATION METHOD THEREOF

(71) Applicants: Jiangsu Aoshen Hi-tech Materials Co., ltd., Lianyungang (CN); Jiangnan University, Wuxi (CN)

(72) Inventors: Shihua Wang, Lianyungang (CN); Ruqiang Zhang, Wuxi (CN); Mingdong Tao, Lianyungang (CN); Zhu Long, Wuxi (CN); Tao Guo, Lianyungang (CN); Yongzhen Zhan, Lianyungang (CN); Xinglong Tang, Lianyungang (CN); Ling Miao, Lianyungang (CN); Chang Sun, Lianyungang (CN)

(73) Assignees: JIANGSU AOSHEN HI-TECH MATERIALS CO., LTD., Lianyungang (CN); JIANGNAN UNIVERSITY, Wuxi (CN)

(*) Notice: Subject to any disclaimer, the term of this patent is extended or adjusted under 35 U.S.C. 154(b) by 0 days.

(21) Appl. No.: 18/325,422

(22) Filed: May 30, 2023

(65) Prior Publication Data
US 2023/0323599 A1    Oct. 12, 2023

Related U.S. Application Data

(63) Continuation of application No. PCT/CN2022/128096, filed on Oct. 28, 2022.

(30) Foreign Application Priority Data

Nov. 11, 2021    (CN) .......................... 202111331937.3

(51) Int. Cl.
*H05K 9/00* (2006.01)
*D21H 13/26* (2006.01)
(Continued)

(52) U.S. Cl.
CPC ............. *D21H 17/12* (2013.01); *D21H 13/26* (2013.01); *D21H 21/14* (2013.01); *H05K 9/009* (2013.01)

(58) Field of Classification Search
CPC .................................................... H05K 9/009
See application file for complete search history.

(56) References Cited

U.S. PATENT DOCUMENTS

2008/0142762 A1* 6/2008 Ni .......................... H01B 1/128
    252/500
2013/0274087 A1   10/2013 Da Silva Pinto et al.
(Continued)

FOREIGN PATENT DOCUMENTS

CN    106750470 A    5/2017
CN    107871541 A    4/2018
(Continued)

*Primary Examiner* — Hung V Ngo
(74) *Attorney, Agent, or Firm* — IPRO, PLLC

(57) ABSTRACT

The present disclosure relates to electromagnetic shielding paper based on modification of a conductive MOF material and a preparation method thereof, and belongs to the technical field of electromagnetic shielding. The method includes the following steps: putting polyimide fibers into a precursor solution of the conductive MOF material, and reacting to obtain MOF material modified PI fibers; mixing the modified fibers with aramid pulp, and carrying out papermaking, squeezing and drying to obtain a paper-based precursor; generating a conductive polymer (polypyrrole) in situ by using a gas-phase polymerization method, and finally obtaining the electromagnetic shielding paper based on the modification of the conductive MOF material. The electromagnetic shielding paper prepared by the present disclosure (Continued)

not only has good conductivity and electromagnetic shielding performance, but also has good mechanical properties and thermal stability.

9 Claims, 2 Drawing Sheets

(51) Int. Cl.
    *D21H 17/12*     (2006.01)
    *D21H 21/14*     (2006.01)

(56) References Cited

U.S. PATENT DOCUMENTS

2015/0140207 A1*   5/2015   Yoon .................... H05K 9/0075
                                                           427/130
2023/0304224 A1*   9/2023   Wang .................... D21H 13/50

FOREIGN PATENT DOCUMENTS

| | | |
|---|---|---|
| CN | 109158094 A | 1/2019 |
| CN | 111111459 A | 5/2020 |
| CN | 111554936 A | 8/2020 |
| CN | 111636239 A | 9/2020 |
| CN | 112663380 A | 4/2021 |
| CN | 112726264 A | 4/2021 |
| CN | 113574731 A | 10/2021 |
| JP | 2019018175 A | 2/2019 |

* cited by examiner

ELECTROMAGNETIC SHIELDING PAPER BASED ON MODIFICATION OF CONDUCTIVE MOF MATERIAL AND PREPARATION METHOD THEREOF

TECHNICAL FIELD

The present disclosure relates to electromagnetic shielding paper based on modification of a conductive MOF material and a preparation method thereof, and belongs to the technical field of electromagnetic shielding.

BACKGROUND

The wide application of electronic products has brought great convenience to our daily life, but the accompanying electromagnetic pollution problem is becoming more and more serious, which not only seriously affects our physical health, but also affects the operation of precision electronic devices, so we have to pay attention to this. Therefore, the application market of electromagnetic shielding materials is huge, and especially, the use of high-frequency electromagnetic waves in the current 5G communication technology requires higher and higher performance of the electromagnetic shielding materials, and promotes the electromagnetic shielding materials to be ultrathin and lightweight and have the characteristics of high temperature resistance, high mechanical strength and broadband absorption.

The currently reported electromagnetic shielding materials mainly include plant fiber paper-based electromagnetic shielding materials and high performance fibers (such as chemical synthetic fibers and inorganic fibers). The plant fiber paper-based electromagnetic shielding materials have poor mechanical properties, water resistance and heat resistance, and are easy to burn. Due to these defects, traditional plant fiber paper-based electromagnetic shielding materials cannot be used in some special environments, such as aerospace, automobile industry and commercial fields. For example, the Chinese patent application CN111286174A disclosed an electromagnetic shielding plant fiber composite material prepared by reducing metal ions on surfaces of plant fibers by means of dopamine; the Chinese patent application CN109610229A disclosed self-fluffy electromagnetic shielding paper prepared by performing chemical nickel plating treatment on plant fibers which serve as base materials. However, all of the electromagnetic shielding paper have poor heat resistance and mechanical properties, and are not suitable for being used in high temperature environments. High performance fibers such as chemical synthetic fibers and inorganic fibers can improve the mechanical properties, heat resistance and water resistance of paper-based materials, and it is possible to overcome the defects of the traditional plant fiber paper-based electromagnetic shielding materials. However, there are almost no active groups on the surfaces of the chemical synthetic fibers, and hydrogen bonding is difficult to generate among fibers, which causes a big technical problem of a wet papermaking process of the chemical synthetic fibers. In addition, due to the surface characteristics of the chemical synthetic fibers, it is difficult to perform functional modification on the chemical synthetic fibers.

SUMMARY

Technical problem: the present disclosure aims to provide electromagnetic shielding paper based on modification of a conductive MOF material, and the electromagnetic shielding paper has the characteristics of high absorption and low reflection even if it is ultrathin and lightweight and at a low filling degree, and thus has good electromagnetic shielding efficiency.

Technical Solution

Polyimide fibers, as a kind of chemical synthetic fiber, have excellent physical and mechanical properties, and are expected to be used in the field of paper-based composite materials. However, due to the characteristics of the chemical synthetic fibers, the polyimide fiber paper-based composite materials have no mature commercial products at home and abroad. On the basis of the characteristics of the polyimide fibers, the application fields of the polyimide fibers can be expanded by overcoming the surface inertness and introducing wave-absorbing materials (such as conductive polymers, carbon nanotubes and graphene) for functional modification. Therefore, on the basis that paper-based sheets have the characteristics of light weight and shape controllability, PI fiber paper is combined with a conductive MOF material and polypyrrole to prepare a structure and function integrated composite material, i.e., the paper-based electromagnetic shielding material, which has the characteristics of light weight and shape controllability. The paper-based electromagnetic shielding material can meet the development trend of lightweight electromagnetic shielding materials, overcome the defects of traditional fiber paper-based electromagnetic shielding materials, solve the problems of heaviness and difficulty in processing of traditional heavy metal plates, ceramic substrates and the like, and has great development prospects. The present disclosure provides ultrathin and lightweight electromagnetic shielding paper with high absorption based on the modification of the conductive MOF material and a preparation method thereof.

The objective of the present disclosure is achieved by the following technical solution: a preparation method of the electromagnetic shielding paper based on the modification of the conductive MOF material includes the following steps:

(1) dispersing nickel chloride hexahydrate and 2,3,6,7,10,11-hexaaminotriphenylene in water, then adding PI fibers for in-situ modification reaction, and after the reaction is finished, taking and drying the fibers to obtain MOF material modified PI fibers;

(2) then dispersing the MOF material modified PI fibers and aramid pulp in water, and carrying out uniform mixing, sheetmaking, squeezing and drying to obtain an MOF material modified PI fiber paper-based conductive framework material; and (3) putting a pyrrole aqueous solution at the bottom in a vacuum glass dryer (not exceeding a porcelain plate), then dipping the MOF material modified PI fiber paper-based conductive framework material in an $FeCl_3$ solution to be saturated, taking out and putting the MOF material modified PI fiber paper-based conductive framework material above the porcelain plate of the vacuum glass dryer, vacuumizing, performing a pyrrole polymerization reaction in and on the surface of the MOF material modified PI fiber paper-based conductive framework material by means of pyrrole volatilization, and after the reaction is finished, washing and drying to obtain the electromagnetic shielding paper based on the modification of the conductive MOF material.

In one embodiment of the present disclosure, in step (1), a mass ratio of the nickel chloride hexahydrate to the 2,3,6,7,10,11-hexaaminotriphenylene to the PI fibers is (6-12):(2-6):20.

In one embodiment of the present disclosure, in step (1), a mass ratio of the nickel chloride hexahydrate to the 2,3,6,7,10,11-hexaaminotriphenylene is (1-6):1, preferably (2.5-3):1.

In one embodiment of the present disclosure, in step (1), the reaction temperature for the in-situ modification reaction is room temperature (20° C.-30° C.).

In one embodiment of the present disclosure, in step (1), the temperature for drying is 100° C. to 110° C.

In one embodiment of the present disclosure, in step (2), a mass ratio of the MOF material modified PI fibers to the aramid pulp is (60-80):(20-40).

In one embodiment of the present disclosure, in step (2), the mass ratio of the MOF material modified PI fibers to the aramid pulp is preferably (60-70):(30-40).

In one embodiment of the present disclosure, in step (2), the quantification of the PI fiber paper-based conductive framework based on the modification of the MOF material is 60 g/m$^2$.

In one embodiment of the present disclosure, in step (2), the pressure for squeezing is 0.3 Mpa to 0.5 Mpa.

In one embodiment of the present disclosure, in step (2), the temperature for drying is 100° C. to 120° C.

In one embodiment of the present disclosure, in step (3), the mass concentration of the FeCl$_3$ solution is 100 g/L to 150 g/L.

In one embodiment of the present disclosure, in step (3), a conductive polymer (polypyrrole) is generated in situ by using a gas-phase polymerization method.

In one embodiment of the present disclosure, in step (3), the mass concentration of the pyrrole aqueous solution is 10 g/L to 15 g/L.

In one embodiment of the present disclosure, in step (3), the vacuum degree of vacuumizing is −0.05 MPa to −0.1 MPa.

In one embodiment of the present disclosure, in step (3), the temperature for polymerization reaction is 0° C., and the reaction time is 2 h to 6 h.

In one embodiment of the present disclosure, in step (3), the temperature for drying is 100° C. to 115° C.

The present disclosure provides electromagnetic shielding paper based on the conductive MOF material prepared by using the above described preparation method.

The present disclosure further provides application of the electromagnetic shielding paper based on the modification of the conductive MOF material in the fields of electromagnetic shielding and electric conduction.

Beneficial Effects

Compared with existing traditional paper-based electromagnetic shielding materials, the electromagnetic shielding paper based on the modification of the conductive MOF material has good electromagnetic wave shielding efficiency, can reduce secondary pollution of electromagnetic radiation, has the characteristics of high absorption and low reflection on electromagnetic waves and high temperature resistance and fire resistance under the condition that the flexibility, ultrathinness and light weight are kept, solves the problems of heaviness and difficulty in processing of traditional metal electromagnetic shielding materials, and also solves the problem that the traditional paper-based electromagnetic shielding materials cannot be operated in severe environments. In addition, the preparation method of the electromagnetic shielding paper based on the modification of the MOF derived material has the advantages of simplicity and low cost and is suitable for industrial mass production. The possibility of mass production is provided for the electromagnetic shielding paper having a complex preparation process.

DETAILED DESCRIPTION

Figure 1:
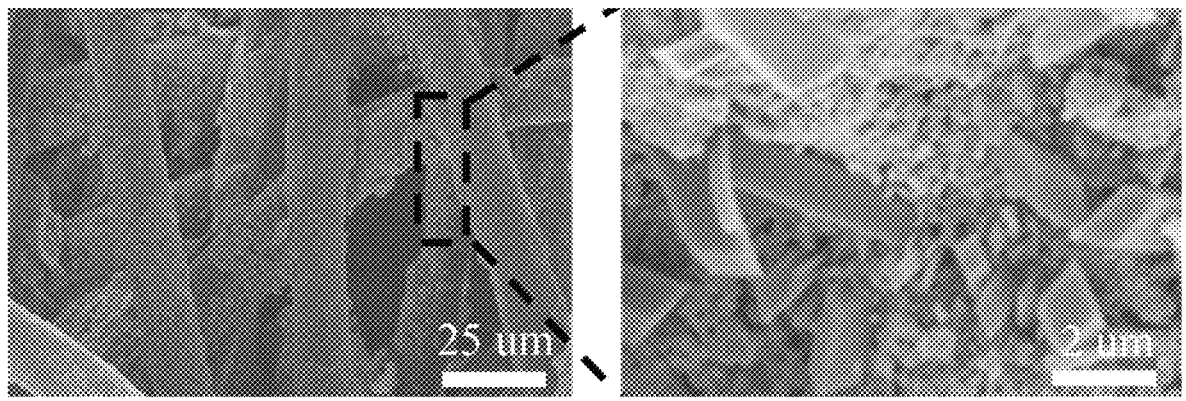
FIG. 1 is an SEM picture of electromagnetic shielding paper based on modification of a conductive MOF material, which is prepared in Example 1 of the present disclosure.
Figure 2:
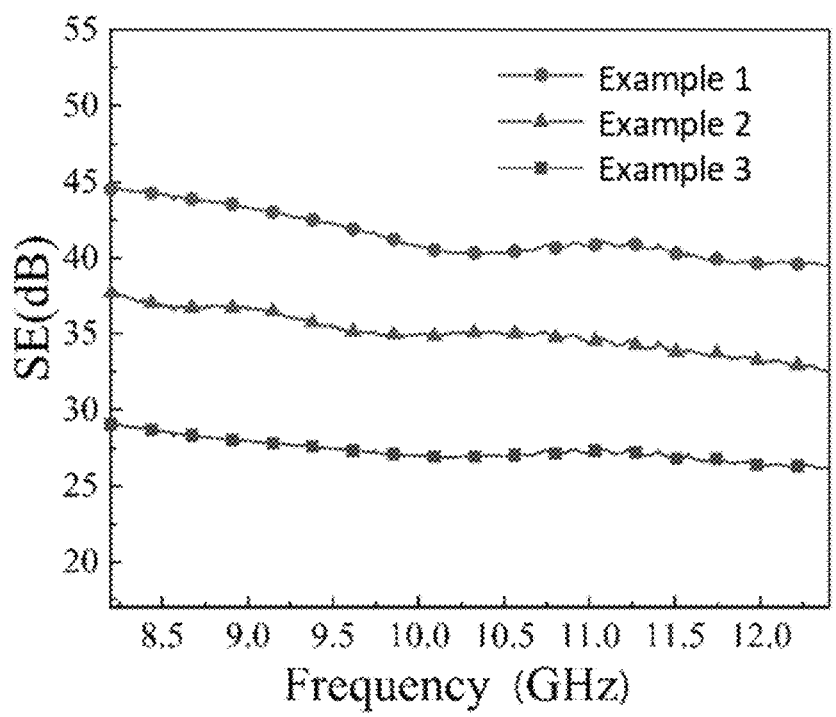
FIG. 2 is an electromagnetic shielding performance graph of electromagnetic shielding paper PPy/Ni-MOF/PI based on modification of a conductive MOF material, which is prepared respectively in Examples 1, 2 and 3 of the present disclosure.
Figure 3:
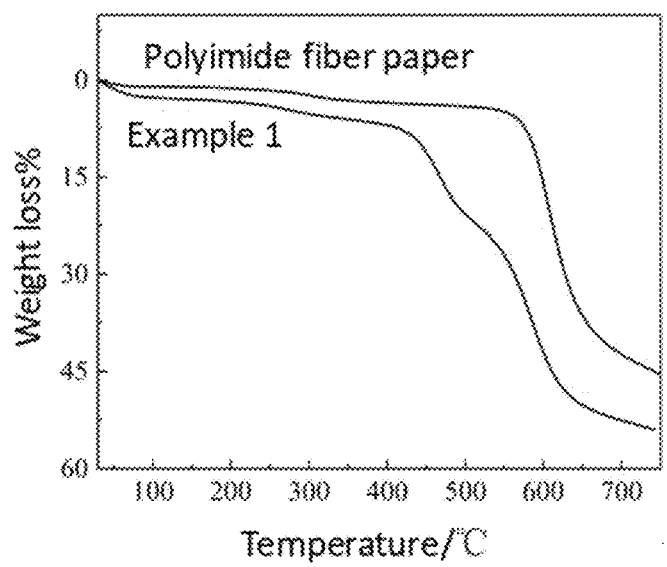
FIG. 3 is a TG curve of the electromagnetic shielding paper based on the modification of the conductive MOF material, which is prepared in Example 1 of the present disclosure.
Figure 4:
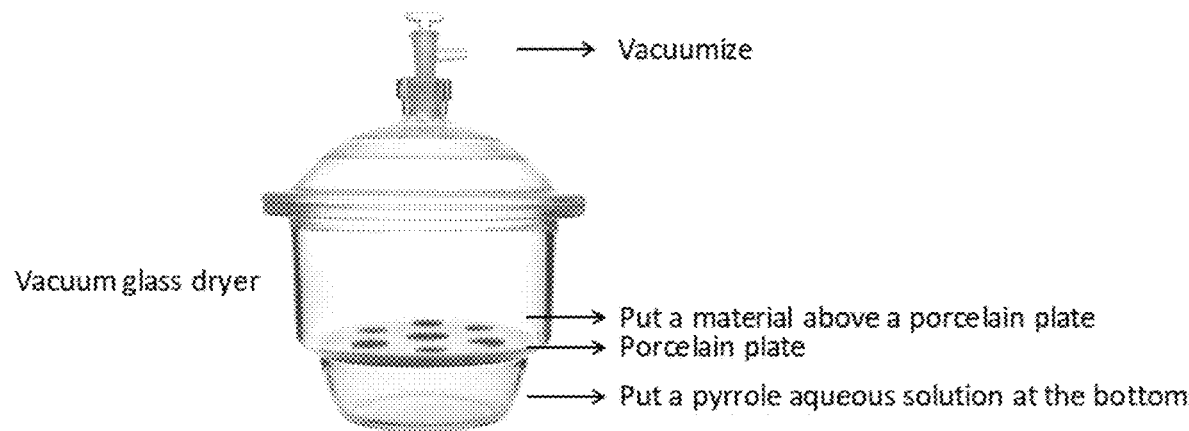
FIG. 4 is a device for generating polypyrrole in situ by using a gas-phase polymerization method in the present disclosure.

The exemplary examples of the present disclosure are described below. It should be understood that the examples are used for preferably explaining the present disclosure but are not intended to limit the present disclosure.

A preparation method of electromagnetic shielding paper based on modification of a conductive MOF material includes the following steps:

step (1): nickel chloride hexahydrate and 2,3,6,7,10,11-hexaaminotriphenylene are added in deionized water, then PI fibers are added, and at room temperature, reaction and drying are performed to obtain MOF material modified PI fibers;

step (2): then the MOF material modified PI fibers and aramid pulp are dispersed in water, and mixing, sheet-making, squeezing and drying are carried out to obtain an MOF material modified PI fiber paper-based conductive framework; and step (3): a pyrrole aqueous solution is put at the bottom in a vacuum glass dryer (not exceeding a porcelain plate), then the MOF material modified PI fiber paper-based conductive framework material is dipped in an FeCl$_3$ solution to be saturated, the MOF material modified PI fiber paper-based conductive framework material is taken out and put above the porcelain plate of the vacuum glass dryer, vacuumizing is performed, a pyrrole polymerization reaction is performed in and on the surface of the MOF material modified PI fiber paper-based conductive framework material by means of pyrrole volatilization, and after the reaction is finished, washing and drying are carried out to obtain the electromagnetic shielding paper based on the modification of the conductive MOF material.

Preferably, in step (1), a mass ratio of the nickel chloride hexahydrate to the 2,3,6,7,10,11-hexaaminotriphenylene to the PI fibers is (6-12):(2-6):20.

Preferably, in step (1), the reaction temperature of the conductive MOF material is room temperature 25° C., and the drying temperature is 100° C. to 110° C.

Preferably, in step (2), a mass ratio of the MOF material modified PI fibers to the aramid pulp is (60-80):(20-40).

Preferably, in step (2), the quantification of the PI fiber paper-based conductive framework based on the modification of the MOF material is 60 g/m².

Preferably, in step (2), the squeezing pressure of the PI fiber paper-based conductive framework based on the modification of the MOF material is 0.3 MPa to 0.5 MPa, and the drying temperature is 100° C. to 120° C.

Preferably, in step (3), the mass concentration of the $FeCl_3$ solution is 100 g/L to 150 g/L.

Preferably, in step (3), the mass concentration of the pyrrole aqueous solution is 10 g/L to 15 g/L.

Preferably, in step (3), the reaction temperature for the polymerization reaction is 0° C., and the reaction time is 2 h to 6 h.

Preferably, in step (3), the drying temperature of the electromagnetic shielding paper based on the modification of the conductive MOF material is 100° C. to 115° C.

Test Method:

1. Tensile Index:

According to a constant speed loading method in GB/T 12914-2008, a sample of a specified size is stretched to fracture by a tensile strength tester under the condition of constant speed loading, the tensile strength is measured, and the tensile index can be calculated from the obtained result and the quantification of the sample.

2. Conductivity Test:

The conductivity of the electromagnetic shielding paper is tested by using an ST2263-four-probe tester.

3. Electromagnetic Shielding Performance Test:

The shielding effect of the electromagnetic shielding paper on electromagnetic waves is measured with a waveguide method by using an E5061A vector network analyzer.

4. Thermal Stability Test:

The temperature index of the sample at 10% of thermal weight loss is tested by using a Q500 thermal gravimetric analyzer to characterize the thermal stability of the electromagnetic shielding paper.

Example 1

1.0 g of nickel chloride hexahydrate and 0.4 g of 2,3,6,7,10,11-hexaaminotriphenylene were added to 40 ml of deionized water and completely dissolved. Then 2 g of PI fibers (3 mm, purchased from Jiangsu Aoshen New Material Co., Ltd) were added to the mixed solution for in-situ synthesis for 24 h. An obtained product was filtered and washed with water for 5 times, and dried at 65° C. to obtain Ni-MOF/PI fibers.

Then 1.32 g of prepared Ni-MOF/PI fibers and 0.56 g of aramid pulp (the water content of 84.2%, the beating degree of 27° SR, 0.3 mm to 0.6 mm, purchased from Shenzhen Xiangu Co., Ltd) were dispersed in 400 g of water and stirred for 5 min. Sheetmaking was carried out on a sheetmaking device. Then squeezing was carried out under the pressure of 0.4 MPa for 5 min. Drying was carried out at 105° C. for 10 min to obtain an MOF material modified PI fiber paper-based conductive framework.

The MOF material modified PI fiber paper-based conductive framework was dipped in 110 g/L of $FeCl_3$ solution to be saturated and taken out. Then the MOF material modified PI fiber paper-based conductive framework was put above a porcelain plate of a vacuum glass dryer. 15 g/L of pyrrole aqueous solution was put at the bottom of the vacuum glass dryer (not exceeding the porcelain plate). Vacuumizing was carried out at the vacuum degree of −0.09 MPa. Reaction was carried out at 0° C. for 12 h. An obtained product was washed for 3 times and dried at 105° C. to obtain electromagnetic shielding paper based on modification of the conductive MOF material.

According to the electromagnetic shielding paper based on the modification of the conductive MOF material prepared in Example 1, the tensile index was 26.3 Nm/g; the temperature at 10% of thermal weight loss was 445° C.; the conductivity was 16.1 S/cm; and the electromagnetic shielding efficiency for the whole X band was 41.0 dB to 44.5 dB.

Example 2

1.2 g of nickel chloride hexahydrate and 0.6 g of 2,3,6,7,10,11-hexaaminotriphenylene were added to 40 ml of deionized water and completely dissolved. Then 2 g of PI fibers were added to the mixed solution for in-situ synthesis for 12 h. An obtained product was filtered and washed with water for 5 times, and dried at 65° C. to obtain Ni-MOF@PI fibers.

Then 1.32 g of prepared Ni-MOF/PI fibers and 0.56 g of aramid pulp were dispersed in 400 g of water and stirred for 5 min. Sheetmaking was carried out on a sheetmaking device. Then squeezing was carried out under the pressure of 0.4 MPa for 5 min. Drying was carried out at 105° C. for 10 min to obtain an MOF material modified PI fiber paper-based conductive framework.

The MOF material modified PI fiber paper-based conductive framework was dipped in 110 g/L of $FeCl_3$ solution to be saturated and taken out. Then the MOF material modified PI fiber paper-based conductive framework was put above a porcelain plate of a vacuum glass dryer. 15 g/L of pyrrole aqueous solution was put at the bottom of the vacuum glass dryer (not exceeding the porcelain plate). Vacuumizing was carried out at the vacuum degree of −0.09 MPa. Reaction was carried out at 0° C. for 12 h. An obtained product was washed for 3 times and dried at 105° C. to obtain electromagnetic shielding paper based on the conductive MOF material.

According to the electromagnetic shielding paper based on the modification of the conductive MOF material prepared in Example 2, the tensile index was 24.5 Nm/g; the temperature at 10% of thermal weight loss was 440° C.; the conductivity was 15.0 S/cm; and the electromagnetic shielding efficiency for the whole X band was 34.0 dB to 37.5 dB.

Example 3

1 g of nickel chloride hexahydrate and 0.4 g of 2,3,6,7,10,11-hexaaminotriphenylene were added to 40 ml of deionized water and completely dissolved. Then 2 g of PI fibers were added to the mixed solution for in-situ synthesis for 24 h. An obtained product was filtered and washed with water for 5 times, and dried at 65° C. to obtain Ni-MOF@PI fibers.

Then 1.32 g of prepared Ni-MOF/PI fibers and 0.56 g of aramid pulp were dispersed in 400 g of water and stirred for 5 min. Sheetmaking was carried out on a sheetmaking device. Then squeezing was carried out under the pressure of 0.4 MPa for 5 min. Drying was carried out at 105° C. for 10 min to obtain an MOF material modified PI fiber paper-based conductive framework.

The MOF material modified PI fiber paper-based conductive framework was dipped in 110 g/L of $FeCl_3$ solution to be saturated and taken out. Then the MOF material modified PI fiber paper-based conductive framework was put above a porcelain plate of a vacuum glass dryer. 12 g/L of pyrrole aqueous solution was put at the bottom of the vacuum glass dryer (not exceeding the porcelain plate). Vacuumizing was carried out at the vacuum degree of −0.09 MPa. Reaction was carried out at 0° C. for 12 h. An obtained product was washed for 3 times and dried at 105° C. to obtain electromagnetic shielding paper based on the conductive MOF material.

According to the electromagnetic shielding paper based on the modification of the conductive MOF material prepared in Example 3, the tensile index was 21.0 Nm/g; the temperature at 10% of thermal weight loss was 450° C.; the conductivity was 12.1 S/cm; and the electromagnetic shielding efficiency for the whole X band was 27.5 dB to 29.0 dB.

Example 4: Preparation of Electromagnetic Shielding Paper from Different MOF Material Modified PI Fiber Paper-Based Conductive Frameworks (I) The mass ratio of nickel chloride hexahydrate to 2,3,6,7,10,11-hexaaminotriphenylene was optimized:

With reference to Example 1, only the amount of nickel chloride hexahydrate was changed to adjust the mass ratio of the nickel chloride hexahydrate to the 2,3,6,7,10,11-hexaaminotriphenylene, and other steps were unchanged to prepare the corresponding electromagnetic shielding paper.

The specific results of the electromagnetic shielding paper are shown in Table 1:

TABLE 1

Performance results of electromagnetic shielding paper prepared from different MOF material modified PI fibers

| Mass ratio of nickel chloride hexahydrate to 2,3,6,7,10,11-hexaamino-triphenylene | Tensile index (N · m/g) | Temperature at 10% of thermal weight loss (° C.) | Conductivity (S/cm) | Electromagnetic shielding efficiency for the whole X band (dB) |
|---|---|---|---|---|
| 5:2 (Example 1) | 26.5 | 445 | 16.0 | 41.0-44.5 |
| 3:1 | 26.1 | 445 | 15.7 | 40.3-42.6 |
| 2:1 | 25.4 | 441 | 14.6 | 35.5-37.0 |
| 3:2 | 24.8 | 440 | 12.4 | 28.0-31.4 |

The results show that: it should be noted from the mechanical properties and electromagnetic shielding efficiency of the electromagnetic shielding paper that the optimal performance of the electromagnetic shielding paper based on the modification of the conductive MOF material is obtained when the mass ratio of the nickel chloride hexahydrate to the 2,3,6,7,10,11-hexaaminotriphenylene is 5:2.

(II) Preparation of Electromagnetic Shielding Paper with Different Mass Ratios of Ni-MOF/PI Fibers to Aramid Pulp With reference to Example 1, only the addition amount of the aramid pulp was changed to adjust the mass ratio of the Ni-MOF/PI fibers to the aramid pulp, and other steps were unchanged to prepare the corresponding electromagnetic shielding paper. The specific results are shown in Table 2:

TABLE 2

Performance results of electromagnetic shielding paper prepared with different mass ratios of Ni-MOF/PI fibers to aramid pulp

| Mass ratio of Ni—MOF/PI fibers to aramid pulp | Tensile index (N · m/g) | Temperature at 10% of thermal weight loss (° C.) | Conductivity (S/cm) | Electromagnetic shielding efficiency for the whole X band (dB) |
|---|---|---|---|---|
| 7:3 (Example 1) | 26.5 | 445 | 16.0 | 41.0-44.5 |
| 6:4 | 25.4 | 441 | 16.4 | 45.5-47.3 |
| 8:2 | 21.2 | 450 | 15.8 | 37.0-40.1 |
| 9:1 | 17.5 | 452 | 15.3 | 30.1-31.7 |

The results show that: it should be noted from the mechanical properties and electromagnetic shielding efficiency of the electromagnetic shielding paper that the optimal performance of the electromagnetic shielding paper based on the modification of the conductive MOF material is obtained when the mass ratio of the Ni-MOF/PI fibers to the aramid pulp is 7:3.

Comparative Example 1

1.0 g of nickel chloride hexahydrate and 0.4 g of 2,3,6,7,10,11-hexaaminotriphenylene were added to 40 ml of deionized water and completely dissolved. Then 2 g of PI fibers were added to the mixed solution for in-situ synthesis for 24 h. An obtained product was filtered and washed with water for 5 times, and dried at 65° C. to obtain Ni-MOF/PI fibers.

Then 1.32 g of prepared Ni-MOF/PI fibers and 0.56 g of aramid pulp were dispersed in 400 g of water and stirred for 5 min. Sheetmaking was carried out on a sheetmaking device. Then squeezing was carried out under the pressure of 0.4 MPa for 5 min. Drying was carried out at 105° C. for 10 min to obtain Ni-MOF/PI fiber paper.

According to the Ni-MOF/PI fiber paper prepared in Comparative Example 1, the tensile index was 16.2 N·m/g; the temperature at 10% of thermal weight loss was 470° C.; the conductivity was 2.0 S/cm; and the electromagnetic shielding efficiency for the whole X band was 11.2 dB to 13.5 dB.

Comparative Example 2

1.32 g of PI fibers and 0.56 g of aramid pulp were dispersed in 400 g of water and stirred for 5 min. Sheetmaking was carried out on a sheetmaking device. Then squeezing was carried out under the pressure of 0.4 MPa for 5 min. Finally, drying was carried out at 105° C. for 10 min to obtain PI fiber paper.

A PI fiber paper-based conductive framework was dipped in 110 g/L of $FeCl_3$ solution to be saturated and taken out. Then the PI fiber paper-based conductive framework was put above a porcelain plate of a vacuum glass dryer. 15 g/L of pyrrole aqueous solution was put at the bottom of the vacuum glass dryer (not exceeding the porcelain plate). Vacuumizing was carried out at the vacuum degree of −0.09 MPa. Reaction was carried out at 0° C. for 12 h. An obtained product was washed for 3 times and dried at 105° C. to obtain PPy/PI fiber paper.

According to the PPy/PI fiber paper prepared in Comparative Example 2, the tensile index was 19 Nm/g; the temperature at 10% of thermal weight loss was 440° C.; the conductivity was 11.0 S/cm; and the electromagnetic shielding efficiency for the whole X band was 20.0 dB to 21.7 dB.

With reference to Comparative Examples 1 and 2 and Example 1, by means of the modification of the conductive MOF material and the introduction of PPy, the electromagnetic shielding performance of the electromagnetic shielding paper is obviously superior to that of the electromagnetic shielding paper modified by a single material. In addition, the prepared electromagnetic shielding paper has good mechanical properties and high heat resistance.

Although the present disclosure has been disclosed with reference to the above exemplary examples, they are not intended to limit the present disclosure, and various changes and modifications can be made by a person skilled in the art without departing from the technique and scope of the present disclosure. Therefore, the protection scope of the present disclosure shall be defined in claims.

What is claimed is:

1. A preparation method of electromagnetic shielding paper based on modification of a conductive MOF material, comprising the following steps:
   (1) dispersing nickel chloride hexahydrate and 2,3,6,7,10,11-hexaaminotriphenylene in water, then adding PI fibers for in-situ modification reaction, and after the reaction is finished, taking and drying the fibers to obtain MOF material modified PI fibers;
   (2) then dispersing the MOF material modified PI fibers and aramid pulp in water, and carrying out uniform mixing, sheetmaking, squeezing and drying to obtain an MOF material modified PI fiber paper-based conductive framework material; and
   (3) putting a pyrrole aqueous solution at the bottom of a vacuum glass dryer, then dipping the MOF material modified PI fiber paper-based conductive framework material in an $FeCl_3$ solution to be saturated, taking out and putting the MOF material modified PI fiber paper-based conductive framework material above a porcelain plate of the vacuum glass dryer, vacuumizing, performing a pyrrole polymerization reaction in and on the surface of the MOF material modified PI fiber paper-based conductive framework material by pyrrole volatilization, and after the reaction is finished, washing and drying and obtaining the electromagnetic shielding paper based on the modification of the conductive MOF material.

2. The method according to claim 1, wherein in step (1), a mass ratio of the nickel chloride hexahydrate to the 2,3,6,7,10,11-hexaaminotriphenylene to the PI fibers is (6-12):(2-6):20.

3. The method according to claim 1, wherein in step (1), a mass ratio of the nickel chloride hexahydrate to the 2,3,6,7,10,11-hexaaminotriphenylene is (2.5-3):1.

4. The method according to claim 1, wherein in step (2), a mass ratio of the MOF material modified PI fibers to the aramid pulp is (60-80):(20-40).

5. The method according to claim 1, wherein in step (2), a mass ratio of the MOF material modified PI fibers to the aramid pulp is (60-70):(30-40).

6. The method according to claim 1, wherein in step (3), the mass concentration of the $FeCl_3$ solution is 100 g/L to 150 g/L.

7. The method according to claim 1, wherein in step (3), the mass concentration of the pyrrole aqueous solution is 10 g/L to 15 g/L.

8. The method according to claim 1, wherein in step (3), the temperature for polymerization reaction is 0° C., and the reaction time is 2 hours to 6 hours.

9. Electromagnetic shielding paper based on a conductive MOF material prepared by using the preparation method according to claim 1.

* * * * *